United States Patent [19]
Kobayashi et al.

[11] Patent Number: 5,812,000
[45] Date of Patent: Sep. 22, 1998

[54] PULSE SIGNAL SHAPER IN A SEMICONDUCTOR INTEGRATED CIRCUIT

[75] Inventors: Isamu Kobayashi; Yasuhiro Yamamoto, both of Kasugai, Japan

[73] Assignee: Fujitsu Limited, Kawasaki, Japan

[21] Appl. No.: 890,888

[22] Filed: Jul. 10, 1997

Related U.S. Application Data

[63] Continuation of Ser. No. 534,861, Sep. 27, 1995, abandoned.

[30] Foreign Application Priority Data

Dec. 26, 1994 [JP] Japan ................................ 6-322376

[51] Int. Cl.[6] ............................................... H03K 3/017
[52] U.S. Cl. ......................... 327/172; 327/175; 327/176; 327/264; 327/278; 327/284
[58] Field of Search ........................... 327/172, 175, 327/176, 264, 278, 284, 299, 298, 227, 230

[56] References Cited

U.S. PATENT DOCUMENTS

| | | | |
|---|---|---|---|
| 4,713,621 | 12/1987 | Nakamura et al. | 327/298 |
| 4,857,868 | 8/1989 | Robb | 327/299 |
| 5,172,010 | 12/1992 | Montegari | 327/172 |
| 5,198,708 | 3/1993 | Gillingham | 307/480 |
| 5,309,034 | 5/1994 | Ishibashi | 327/172 |
| 5,396,110 | 3/1995 | Houston | 327/172 |
| 5,506,533 | 4/1996 | Wu | 327/227 |
| 5,546,034 | 8/1996 | Han | 327/176 |

*Primary Examiner*—Timothy P. Callahan
*Assistant Examiner*—Jung Ho Kim
*Attorney, Agent, or Firm*—Armstrong, Westerman, Hattori, McLeland and Naughton

[57] ABSTRACT

A pulse signal shaper supplying a pulse signal having a stable pulse width, including an input circuit that produces a first pulse signal in response to an input signal, a delay circuit that produces a second pulse signal obtained by delaying the first pulse signal by a predetermined time, and a signal mixing circuit that is connected to the input circuit and the delay circuit. The mixing circuit combines the first pulse signal and the second pulse signal to produce a third pulse signal having a pulse width equal to or greater than a delay time provided by the delay circuit, and supplies the third pulse signal as an output signal from the pulse signal shaper. In a preferred embodiment, the input circuit includes an oscillator responsive to the input signal. When the input signal has a higher frequency than a predetermined frequency, the input signal is supplied as the first pulse signal at a frequency equal to te frequency of the input signal. When the input signal has a lower frequency than the predetermined frequency, the first pulse signal is supplied at the predetermined frequency.

13 Claims, 13 Drawing Sheets

5,812,000

PULSE SIGNAL SHAPER IN A SEMICONDUCTOR INTEGRATED CIRCUIT

This application is a continuation of application Ser. No. 08/534,861 filed Sep. 27, 1995, now abandoned.

BACKGROUND OF THE INVENTION

1. Field of the Invention

The present invention relates generally to a pulse signal shaper which supplies a signal having a predetermined pulse width to internal circuits in a semiconductor integrated circuit. More particularly, this invention relates to the production of pulse signals having stable pulse widths.

2. Description of the Related Art

A semiconductor integrated circuit has a pulse signal generator and internal circuits which operate in response to control signals produced by the pulse signal shaper. The pulse signal shaper produces a control signal in response to an external clock signal which is supplied from an external unit (e.g., CPU). The pulse signal shaper, incorporated in a semiconductor integrated circuit like a memory, produces a control signal in response to a signal supplied from the control circuit of the integrated circuit. Recently, semiconductor integrated circuits with faster operational speeds are widely used. In this respect, the pulse signal shaper should produce a control signal having a stable high frequency.

FIG. 1 is a circuit diagram showing a conventional pulse signal shaper 100. This pulse signal shaper is incorporated in, for example, a RAM equipped with a latch circuit for latching read data. The shaper 100 produces an output signal OUT to control the latch circuit in response to an input signal IN1 or IN2. This output signal OUT has the pulse which maintains a high potential more than a given time. The latch circuit latches the read data in response to the rising of the pulse in the output signal OUT, and supplies the latched data to the output circuit of the RAM in response to the falling of that pulse.

The pulse signal shaper 100 comprises a series circuit of two stages of NAND gates 50 and 52, two stages of CMOS inverter circuits 1b and 1c, connected between both NAND gates 50 and 52, two stages of inverter circuits 1e and 1f connected to the NAND gate 52. The NAND gate 50 has a CMOS inverter circuit 1a which has an input terminal supplied with the input signal IN1 and an output terminal connected to the input terminal of the inverter circuit 1b. The NAND gate 50 further has an N channel MOS transistor Tr1 and a P channel MOS transistor Tr2. The transistor Tr1 is connected between the source of an N channel MOS transistor included in the inverter circuit 1a and ground GND as a low-potential power supply. The transistor Tr2 is connected between the output terminal of the inverter circuit 1a any a high-potential power supply $V_{cc}$. Further, both transistors Tr1 and Tr2 have gates responsive to the input signal IN2. When the input signals IN1 and IN2 are both high, the NAND gate 50 outputs a low-potential signal, setting the potential at a node N1 between the NAND gate 50 and the inverter circuit 1b at a low level. When either the input signal IN1 or IN2 has a low level, the potential at the node N1 is set high.

The NAND gate 52 has a CMOS inverter circuit 1d which has an input terminal connected to the output terminal (node N2) of the inverter circuit 1c and an output terminal connected to the input terminal of the inverter circuit 1e. The NAND gate 50 further has an N channel MOS transistor Tr3 and a P channel MOS transistor Tr4. The transistor Tr3 is connected between the source of an N channel MOS transistor included in the inverter circuit 1d and the ground GND. The transistor Tr4 is connected between the output terminal of the inverter circuit 1d and the high-potential power supply $V_{cc}$. Further, both transistors Tr3 and Tr4 have gates connected to the node N1. When the potentials at the node N1 and N2 are high, the NAND gate 52 outputs a low-potential signal. When one of the potentials at the node N1 and N2 is a low, the NAND gate 52 outputs a high-potential signal. In this manner, the pulse signal shaper 100 outputs the signal from the NAND gate 52 as the output signal OUT via the inverter circuits 1e and 1f.

FIG. 2 presents a waveform chart illustrating the operation of the pulse signal shaper 100. The input signals IN1 and IN2 represent substantially equal pulse widths and frequencies. Assume that there exist a pulse p1 in the input signal IN1 and a pulse P2 in the input signal IN2, which is delayed from the pulse P1. When the high states of the pulses P1 and P2 overlap each other, the NAND gate 50 outputs a low-potential signal, dropping the potential at the node N1. Then, the NAND gate 50 raises the potential at the node N1 in response to the falling of the pulse P1. In other words, the duration of the overlapping high state of the pulses P1 and P2 is equal to time t1 in which the node N1 is set low.

After time t2 delayed from the falling of the potential at the node N1, the inverter circuits 1b and 1c transfer the potential of the node N1 to the node N2, thus dropping the potential of the node N2. The time where the potential of the node N2 is held low is t1. When the time in which both the pulses P1 and P2 are high is shorter than delay time t2, the potential at the node N2 falls before the rising of the potential at the node N1. The NAND gate 52 outputs a high-potential signal during time t1+t2 which extends from the falling of the potential at the node N1 to the rising of the potential at the node N2. The pulse signal shaper 100 therefore outputs the high-level output signal OUT via the inverter circuits 1e and 1f during time t1+t2.

Further, assume that there are a pulse P3 and a pulse P4 whose phase coincides with that of the pulse P3. In this case, the high-level state overlaps during the period equal to the pulse width of each of the pulses P3 and P4. As a result, the signals at the nodes N1 and N2 have pulse widths longer than t1. Accordingly, the output signal OUT having a long high-level pulse width is supplied. It is also assumed that there exist a pulse P5 and a pulse P6 which has a large phase difference with respect to the phase of the pulse P5. In this case, the high-level state overlaps during the period shorter than t1, so that the potential at the node N1 is held low in a short time t3. This permits the potential at the node N2 to fall after the rising of the potential at the node N1, so that the shaper 100 outputs the output signal OUT having a short pulse width t3. This makes it difficult for the latch circuit to reliably latch a data signal, thus preventing the supply of accurate output data.

FIG. 3 is a block diagram showing another conventional pulse signal shaper. This pulse signal shaper is incorporated in a semiconductor integrated circuit, and comprises a selector 200 responsive to an external clock signal C supplied from an external unit and an internal oscillator 300. The internal oscillator 300 produces an oscillation signal OS of a lower frequency than that of the external clock signal C, and supplies it to the selector 200. The selector 200 produces an internal clock signal CLK which is synchronous with the external clock signal and supplies the internal clock signal CLK to the internal circuit in the semiconductor integrated circuit. The selector 200 produces the clock signal CLK while the external clock signal C keeping a constant frequency is being supplied. When the supply of the external clock signal C is stopped, the selector 200 detects the event and supplies the oscillator signal OS from the internal oscillator 300 as the clock signal CLK.

FIG. 4 is a timing waveform chart illustrating the operation of this pulse signal shaper. When being supplied with the external clock signal C, the selector 200 produces the internal clock signal CLK. When the supply of the external clock signal C is stopped and no pulse has been detected even after more than a preset period t1 passes, the selector 200 sets a select signal S1 high and outputs the oscillation signal OS as the clock signal CLK. The supply of the oscillation signal OS as the internal clock signal CLK instead of the external clock signal C allows the internal circuit to continuously function.

The disadvantage of this pulse signal shaper is that the external clock signal C is not synchronous with the oscillation signal OS at all. As shown in FIG. 5, the select signal S1 rises when time t1 passes after the supply of the external clock signal C is stopped. When the rising of this clock signal C overlaps the high-duration of the oscillation signal OS, the selector 200 outputs a clock signal CLK1 which has a very short high-level pulse width. Further, the overlap of the rising of the external clock signal C, the falling of the select signal S1 and the falling of the oscillation signal OS permits the supply of a clock signal CLK2 which has a long pulse width and includes a glitch. Those clock signals CLK1 and CLK2 cause the internal circuit to malfunction.

SUMMARY OF THE INVENTION

Accordingly, it is a primary objective of the present invention to provide a pulse signal shaper which supplies a pulse signal having a stable pulse width. In one aspect of the invention, as shown in FIG. 6, a pulse signal shaper includes an input circuit 19 that produces a first pulse signal in response to an input signal, a delay circuit 21 that produces a second pulse signal obtained by delaying the first pulse signal by a predetermined time, and a signal mixing circuit 21 that is connected to the input circuit 19 and the delay circuit 20. This mixing circuit 21 combines the first pulse signal and the second pulse signal to produce a third pulse signal having a pulse width equal to or greater than a delay time provided by the delay circuit 20, and supplies the third pulse signal as an output signal from the pulse signal shaper.

In another aspect of the invention, the input circuit further includes a NAND gate responsive to at least one input signal. The delay circuit includes a plurality of inverter circuits connected in series. The signal mixing circuit includes a NAND gate which is responsive to the first pulse signal produced by the input circuit and the second pulse signal produced by the delay circuit.

In another aspect of the invention, the signal mixing circuit includes a first NAND gate, that is connected to the input circuit and the delay circuit and produces the third pulse signal, and a second NAND gate that is connected to the delay circuit and the first NAND gate that produces an intermediate pulse signal having a predetermined pulse width in response to the second pulse signal from the delay circuit and the third pulse signal from the first NAND gate. The first NAND gate produces the third pulse signal whose pulse width is equal to or greater than the delay time provided by the delay circuit in response to the intermediate pulse signal and the first pulse signal from the input circuit.

In yet another aspect of the invention, the input circuit includes an oscillator which is responsive to the input signal. When the input signal has a higher frequency than a predetermined frequency, the input signal is supplied as the first pulse signal at a frequency equal to the frequency of the input signal. When the input signal has a lower frequency than the predetermined frequency, the first pulse signal is supplied at the predetermined frequency. The delay circuit includes a plurality of first inverter circuits connected in series, and the signal mixing circuit includes a D flip-flop circuit having a clock terminal for receiving the first pulse signal as a clock signal, a data terminal, and an output terminal. The output terminal is connected to the data terminal via the first inverter circuits. This D flip-flop circuit is responsive to both the first pulse signal from the oscillator and the second pulse signal from the delay circuit. The D flip-flip circuit supplies the third pulse signal having a lower one of frequencies of the first and second pulse signals to the output terminal.

In another aspect of the invention, the oscillator includes NAND gates which are responsive to the input signal and a plurality of second inverter circuits which are connected to one another in a ring form, with internal delay circuits between each pair of second inverter circuits. Each internal delay circuits is responsive to an inverted signal supplied from one of the second inverter circuits. When the inverted signal rises from a low level to a high level, the internal delay circuit supplies a delay signal having a delay of at least a pulse width of the input signal to one of the second inverter circuits which is located at a subsequent stage.

In another aspect of the invention, the oscillator includes a first oscillator and a second oscillator. The first oscillator is responsive to the input signal which holds a high-level potential for a longer time than a preset period and supplies the first pulse signal having the preset period to the D flip-flop and is responsive to the input signal having a shorter period than the preset period and supplies the first pulse signal having the same period as the input signal to the D flip-flop. The second oscillator is responsive to the input signal which holds a low-level potential for a longer time than the preset period and supplies the first pulse signal having the preset period to the D flip-flop, and is responsive to the input signal having a shorter period than the preset period and supplies the first pulse signal having the same period as the input signal to the D flip-flop.

In yet another aspect of the invention, the pulse signal further includes an XOR gate and an even number of second inverter circuits connected in series. The XOR gate has a first input terminal connected to an output terminal of the D flip-flop circuit, a second input terminal connected to the output terminal of the D flip-flop circuit via the second inverter circuits, and an output terminal from which the third pulse signal having a same period as the input signal is supplied.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

DETAILED DESCRIPTION OF THE PREFERRED EMBODIMENTS

First Embodiment

Figure 1:
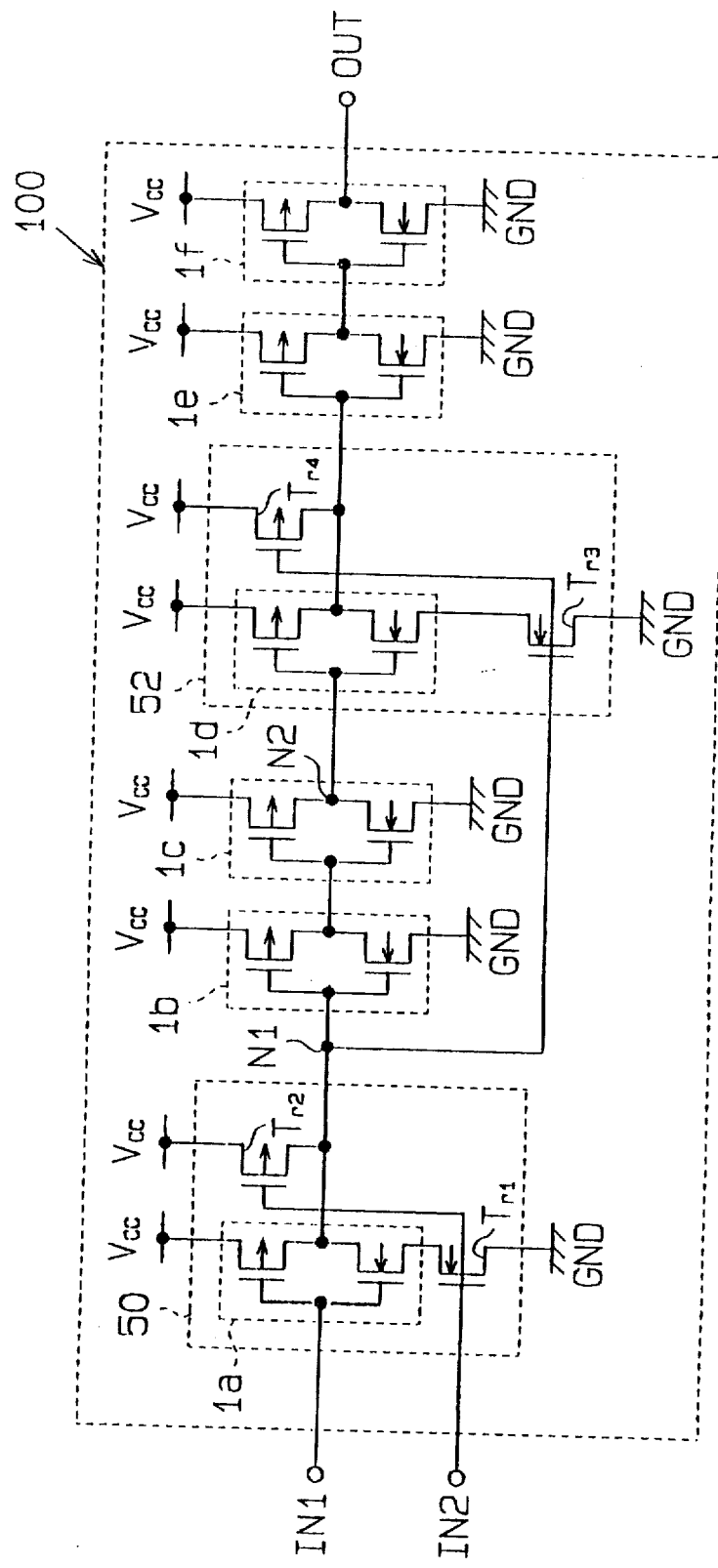
FIG. 1 is a circuit diagram illustrating a pulse signal shaper according to a first prior art.
Figure 2:
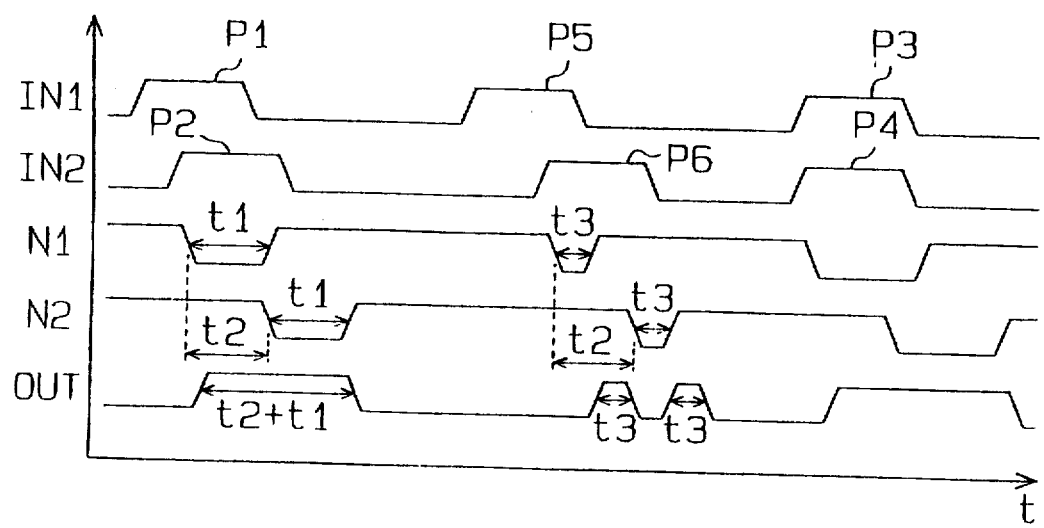
FIG. 2 is a waveform chart illustrating the operation of the pulse signal shaper in FIG. 1.
Figure 3:
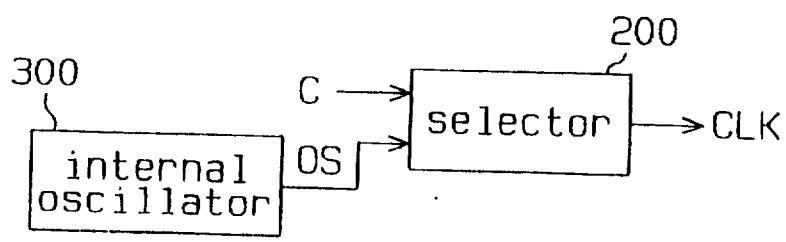
FIG. 3 is a block diagram illustrating a pulse signal shaper according to a second prior art.
Figure 4:
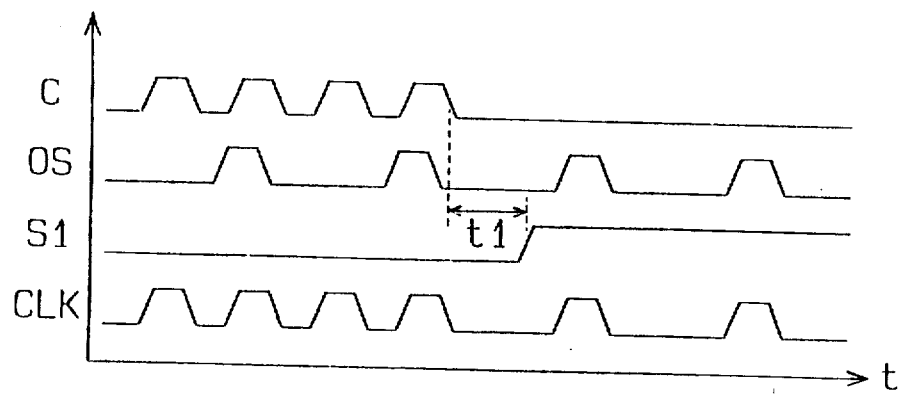
FIG. 4 is a waveform chart illustrating the operation of the pulse signal shaper in FIG. 3.
Figure 5:
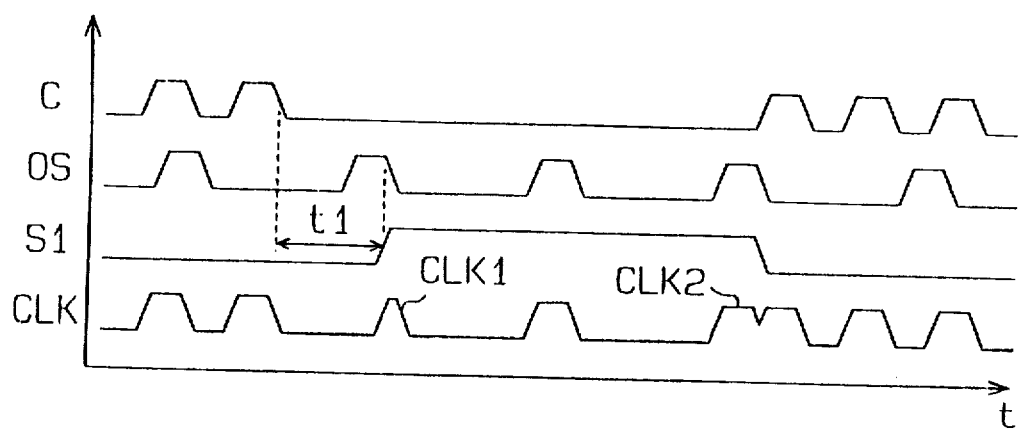
FIG. 5 is a waveform chart illustrating the operation of the pulse signal shaper in FIG. 3.
Figure 6:
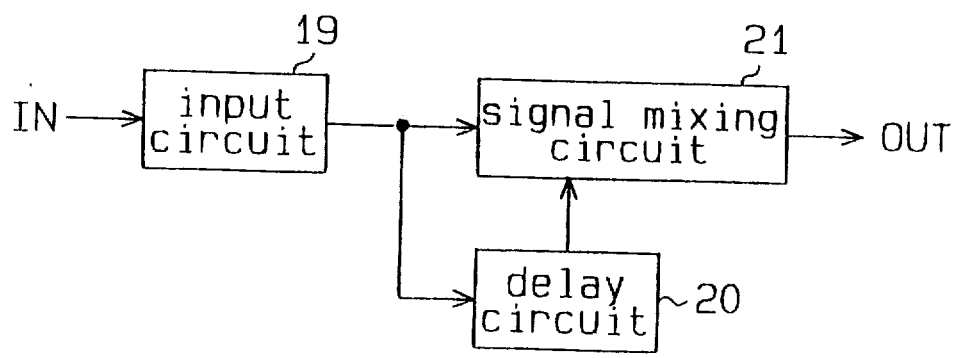
FIG. 6 is a schematic diagram showing the outline of this invention.
Figure 7:
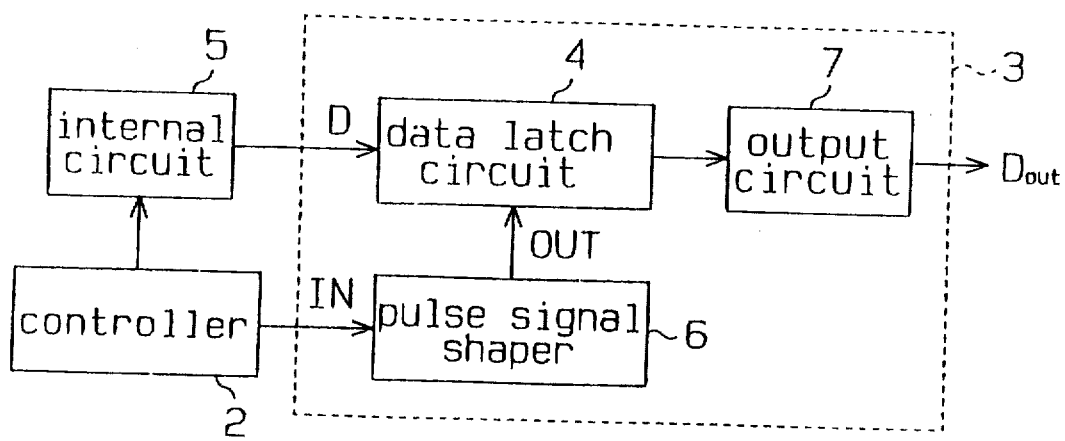
FIG. 7 is a block diagram showing a read data output circuit which is associated with first and second embodiments.

The first embodiment of the present invention will now be described referring to the accompanying drawings. According to this embodiment, this invention is adapted for a read data output circuit 3 for a semiconductor memory device as shown in FIG. 7.

The semiconductor memory device comprises a controller 2, an internal circuit 5 including a memory cell array and the read data output circuit 3. The read data output circuit 3 includes a data latch circuit 4, a pulse signal shaper 6 and an output circuit 7. The controller 2 controls the operation of the internal circuit 5 and supplies an output control signal IN to the pulse signal shaper 6. The internal circuit 5 supplies read data D to the data latch circuit 4 under the control of the controller 2. In response to the output control signal IN, the pulse signal shaper 6 produces an output signal (pulse signal) OUT and supplies it to the data latch circuit 4. The data latch circuit 4 latches the read data D in response to the rising of the output signal OUT from the pulse signal shaper 6 to the high state from the low state. Further, the data latch circuit 4 supplies the latched read data D to the output circuit 7 in response to the falling of the output signal OUT to the low state from the high state. The output circuit 7 produces output data Dout obtained by amplifying the output signal of the data latch circuit 4 to output the data Dout.

Figure 8:
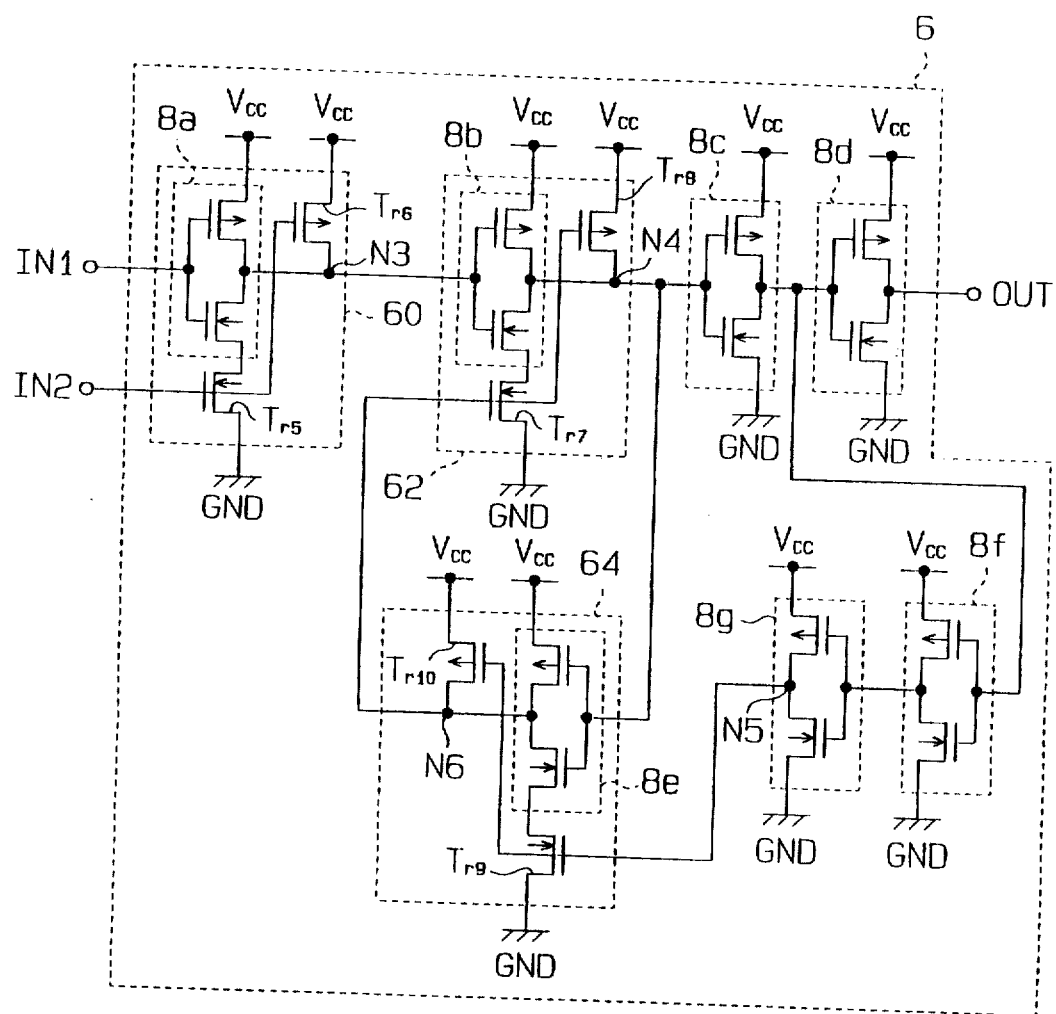
FIG. 8 is a circuit diagram illustrating a pulse signal shaper according to the first embodiment.

FIG. 8 is a circuit diagram showing the pulse signal shaper 6. In the first embodiment, the controller 2 supplies two signals IN1 and IN2 as the output control signal IN to the pulse signal shaper 6. The pulse signal shaper 6 has three NAND gates 60, 62 and 64, and four CMOS inverter circuits 8c, 8d, 8f and 8g. Further, the NAND gates 60, 62 and 64 have CMOS inverter circuits 8a, 8b and 8e, respectively.

The inverter circuit 8a which has an input terminal supplied with the input signal IN1 and an output terminal connected to the input terminal of the inverter circuit 8b. The NAND gate 60 further has an N channel MOS transistor Tr5 and a P channel MOS transistor Tr6. The transistor Tr5 is connected between the source of an N channel MOS transistor included in the inverter circuit 8a and ground GND as a low-potential power supply. The transistor Tr6 is connected between the output terminal of the inverter circuit 8a and a high-potential power supply $V_{cc}$. Further, both transistors Tr5 and Tr6 have gates responsive to the input signal IN2. When the input signals IN1 and IN2 are both high, the NAND gate 60 outputs a low-potential signal, setting the potential at a node N3 between the NAND gate 60 and the inverter circuit 8b at a low level. When either the input signal IN1 or IN2 has a low level, the potential at the node N3 is set high.

The inverter circuit 8b has an output terminal (node N4) connected to the input terminal of the inverter circuit 8c. The NAND gate 62 further has an N channel MOS transistor Tr7 and a P channel MOS transistor Tr8. The transistor Tr7 is connected between the source of an N channel MOS transistor included in the inverter circuit 8b and the ground GND. The transistor Tr8 is connected between the node N4 and the power supply $V_{cc}$. Both transistors Tr7 and Tr8 have gates connected to the output terminal (node N6) of the inverter circuit 8e. When the potentials of nodes N3 and N6 are both high, the NAND gate 62 outputs a low-potential signal, setting the potential of the node N4 low. When one of the potentials of the nodes N3 and N6 is low, the potential of the node N4 is set high. The inverter circuit 8c has an output terminal connected to the input terminals of the inverter circuits 8d and 8f. The inverter circuit 8d has an output terminal from which the output signal OUT is output. The inverter circuit 8f has an output terminal connected to the input terminal of the inverter circuit 8g.

The inverter circuit 8e has an input terminal connected to the node N4. The NAND gate 64 further has an N channel MOS transistor Tr9 and a P channel MOS transistor Tr10. The transistor Tr9 is connected between the source of an N channel MOS transistor included in the inverter circuit 8e and ground GND. The transistor Tr10 is connected between the node N6 and the high-potential power supply $V_{cc}$. Both transistors Tr9 and Tr10 have gates connected to the output terminal (node N5) of the inverter circuit 8g. When the potentials at the nodes N4 and N5 are both high, the NAND gate 64 outputs a low-potential signal, setting the potential at the node N6 low. When one of the potentials at the nodes N4 and N5 is low, the potential at the node N6 is set high.

Figure 9:
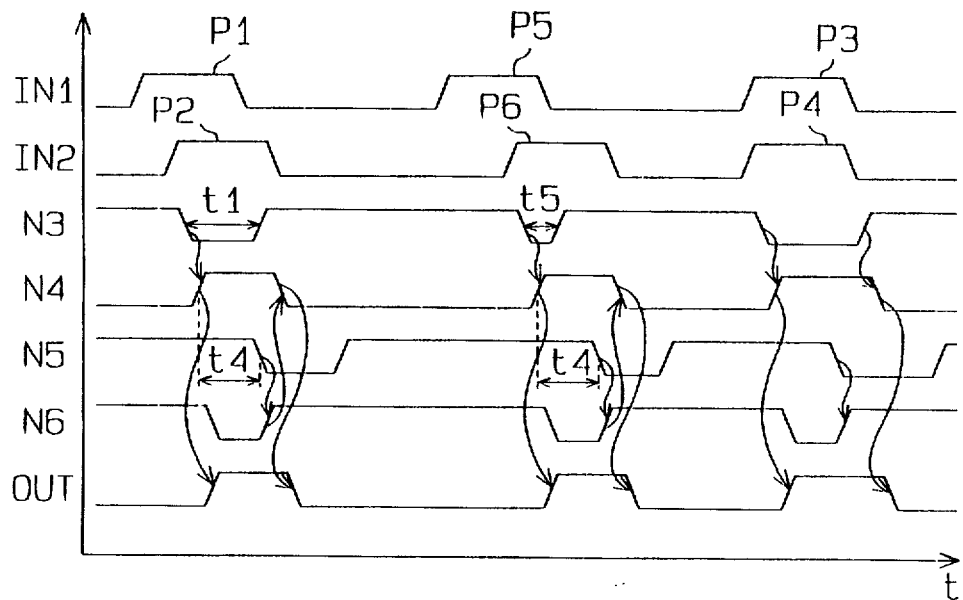
FIG. 9 is a waveform chart illustrating the operation of the pulse signal shaper in FIG. 8.

FIG. 9 presents a waveform chart illustrating the operation of the pulse signal shaper 6. The input signals IN1 and IN2 represent substantially equal pulse widths and frequencies. Assume that there exist a pulse P1 in the input signal IN1 and a pulse P2 in the input signal IN2, which is delayed from the pulse P1. When the high states of the pulses P1 and P2 overlap each other, the NAND gate 60 sets the potential at the node N3 low. When the pulse P1 falls next, the potential at the node N3 rises to the high state. In other words, the duration of the overlapping high state of the pulses P1 and P2 is equal to time t1 in which the node N3 is set low.

When the potential at the node N3 falls, the NAND gate 62 sets the potential at the node N4 high. Then, the output signal OUT rises to the high state with a delay from the rising of the potential at the node N4 by the inverter circuits 8c and 8d. The node N5 is held at the high potential by the inverter circuits 8g and 8f before the potential at the node N4 rises. When the potential at the node N4 rises, therefore, the NAND gate 64 sets the potential at the node N6 low. In response to the falling of the potential at the node N6, the transistor Tr7 is turned off and the transistor Tr8 is turned on. As a result, the potential at the node N4 is held high regardless of the rising of the potential at the node N3.

When delay time t4 from the rising of the potential at the node N4 passes, the potential at the node N5 falls low and the potential at the node N6 rises high. This time t4 is produced by the operation of the inverter circuits 8c, 8f and 8g. Since the potential at the node N3 has already risen high at this time, the potential at the node N4 falls low. Accordingly, the output signal OUT falls low with a some delay from the falling of the potential at the node N4. This permits the supply of the output signal OUT which has a pulse width slightly longer than the delay time t4. When the delay time t4 from the falling of the potential at the node N4 passes, the potential at the node N5 rises high.

Further, assume that there exist a pulse P3 and a pulse P4 which is in phase with the pulse P3. In this case, the high-level state overlaps during the period equal to the pulse width of each of the pulses P3 and P4. As a result, the node N3 holds the low potential for a time longer than t1. The pulse width of the low potential at the node N3 is equal to the pulse width of the pulses P3 and P4. When the potential at the node N5 falls after the passage of the delay time t4 and the potential at the node N6 rises in response to the falling action, the node N3 is still holding the low potential. While the node N3 is holding the low potential, the node N4 is permitted to keep the high potential. Consequently, the pulse width of the high potential at the node N4 becomes equal to the pulse width of the low potential at the node N3. In this manner, the pulse signal shaper 6 supplies the output signal OUT with a long high-level pulse width like the pulse at the node N4.

It is also assumed that there exist a pulse P5 and a pulse P6 which has a large phase difference with respect to the phase of the pulse P5. In this case, the high-level state overlaps during the period shorter than t1, so that the potential at the node N3 is held low in a short time t5. However, the node N4 keeps the high potential until the potential at the node N6 rises since the falling of the potential at the node N5 after the passage of the delay time t4. This permits the potential at the node N4 to have a pulse width slighting longer than the delay time t4. Consequently, the pulse signal shaper 6 sends out the output signal OUT whose long pulse width is equal to that of the potential at the node N4.

As described above, this pulse signal shaper 6 can send the output signal OUT whose high-level pulse width is longer than the delay time t4 to the data latch circuit 4 irrespective of the phase difference between the input signals IN1 and IN2. This permits the latch circuit 4 to reliably latch data D and supply the latched data D to the output circuit 7.

Second Embodiment

Figure 10:
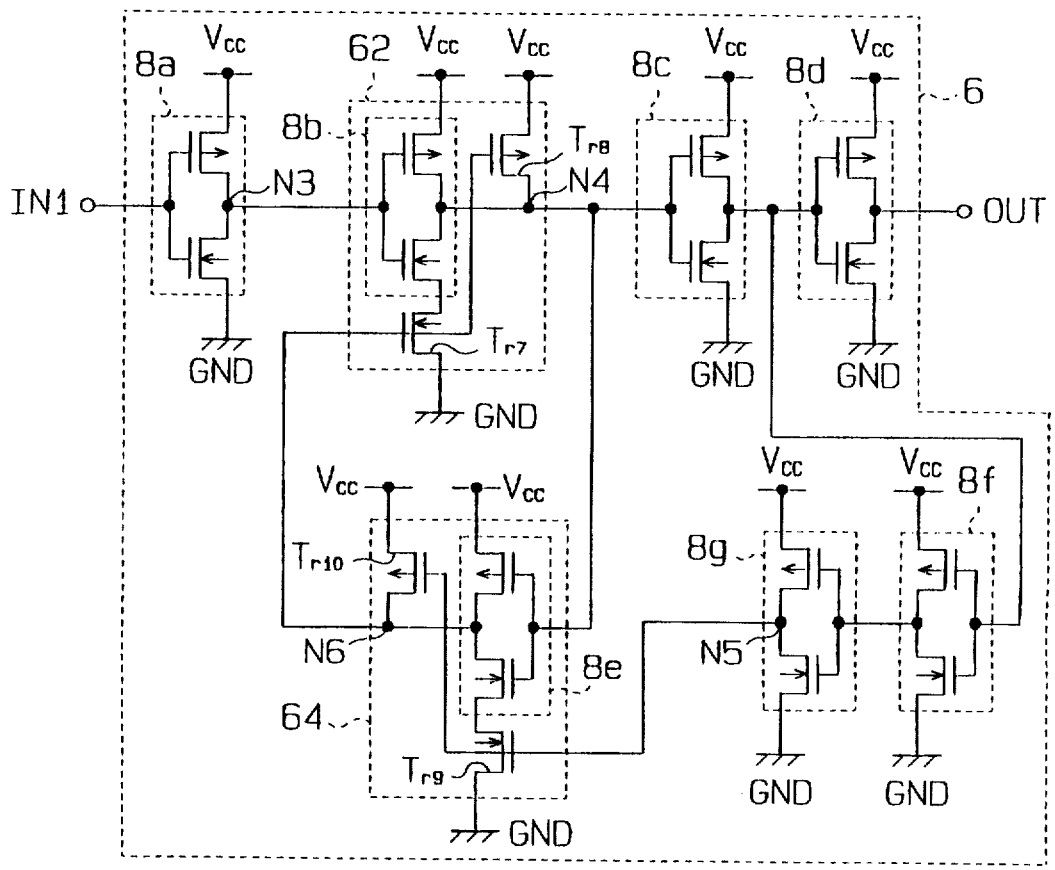
FIG. 10 is a circuit diagram illustrating a pulse signal shaper according to the second embodiment.

The second embodiment of the pulse signal shaper 6 will now be discussed with reference to FIGS. 10 and 11. As shown in FIG. 10, the pulse signal shaper 6 produces an output signal OUT whose pulse width is equal to or greater than a predetermined value in response to one input signal IN1. Accordingly, this pulse signal shaper 6 is equipped with the inverter circuit 8a responsive to the input signal IN1 in place of the NAND gate 60. The other circuits are the same as those of the first embodiment.

Figure 11:
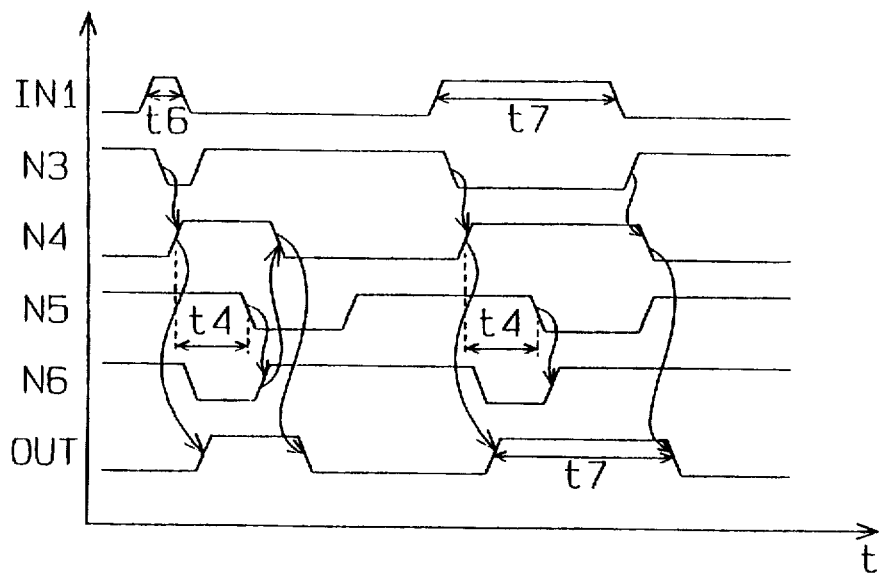
FIG. 11 is a waveform chart illustrating the operation of the pulse signal shaper in FIG. 10.

FIG. 11 presents a waveform chart illustrating the operation of the pulse signal shaper 6. It is assumed that the input signal IN1 has a high-level pulse width t6 shorter than the delay time t4. In response to the input signal IN1, the inverter circuit 8a outputs an inverted input signal to set the potential at the node N3 low. In response to this potential falling at the node N3, the potential at the node N4 rises. Subsequently, in response to the potential rise at the node N4, the potential at the node N6 falls and the output signal OUT rises. When the delay time t4 passes after the rising of the potential at the node N4, the potential at the node N5 falls and the potential at the node N6 then rises. In response to the potential rise at the node N6, the potential at the node N4 falls and the output signal OUT falls. In this manner, the pulse signal shaper 6 sends the output signal OUT having the high-level pulse width longer than the delay time t4 to the latch circuit 4, in response to the input signal IN1 whose pulse width t6 is shorter than the delay time t4.

It is also assumed that the input signal IN1 has a pulse width t7 longer than the delay time t4. The inverter circuit 8a outputs an inverted input signal to set the potential at the node N3 low. In response to this potential falling at the node N3, the potential at the node N4 rises. In response to the potential rise at the node N4, the potential at the node N6 falls and the output signal OUT rises. When the delay time t4 passes after the rising of the potential at the node N4, the potential at the node N5 falls and the potential at the node N6 then rises. Since the node N3 is still holding the low potential at this time, the node N4 keeps the high potential. Next, in response to the potential rise at the node N3, the potential at the node N4 falls and the output signal OUT falls. In response to the input signal IN1 having a pulse width t7 longer than the delay time t4, the pulse signal shaper 6 sends the output signal OUT having the high-level pulse width equal to the pulse width t7 to the latch circuit 4.

As described above, the pulse signal shaper 6 of the second embodiment can output the output signal OUT whose high-level pulse width is longer than the delay time t4 as in the first embodiment in response to the input signal IN1 having an arbitrary pulse width. Further, when the gate width of the P channel MOS transistor in the inverter circuit 8b is about 10 times that of the N channel MOS transistor, this embodiment is advantageous in the following point. In response to the falling of the potential at the node N3 having a short pulse width, the inverter circuit 8b can quickly and reliably rise the potential at the node N4. This can improve the sensitivity to the input signal IN1.

Third Embodiment

Figure 12:
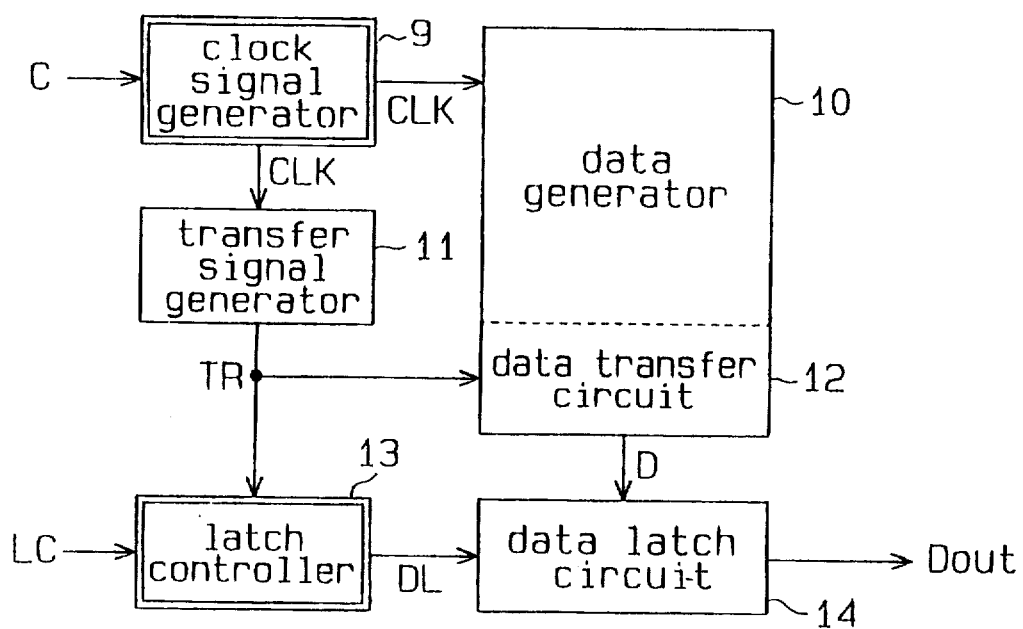
FIG. 12 is a block diagram showing a data transfer circuit which is associated with third to sixth embodiments.

The third embodiment of this invention will now be described referring to the accompanying drawings. According to this embodiment, this invention is adapted for a data transfer apparatus as illustrated in FIG. 12.

The data transfer apparatus comprises a clock signal generator 9 as a pulse signal shaper, a data generator 10 including a counter, a transfer signal generator 11, a latch controller 13 and a data latch circuit 14. The data generator 10 has a data transfer circuit 12. The clock signal generator 9 has an oscillator. In response to an external clock C supplied from an external unit (not shown) like a CPU, the clock signal generator 9 generates a clock signal CLK which is synchronous with the external clock C. This clock signal CLK is supplied to the data generator 10 and the transfer signal generator 11. When the supply of the external clock C is stopped, the clock signal generator 9 produces a clock signal CLK having a lower frequency than the frequency of the external clock C.

In response to the clock signal CLK, the data generator 10 produces data which is in turn sent to the data transfer circuit 12. The transfer signal generator 11 produces a transfer signal TR in response to the clock signal CLK, and sends the transfer signal TR to the data transfer circuit 12 and the latch controller 13. In response to the high-level transfer signal TR, the data transfer circuit 12 transfers the data D, supplied from the data generator 10, to the data latch circuit 14. The latch controller 13 is responsive to a latch control signal LC supplied from an external unit (not shown). In response to the high-level latch control signal LC and the high-level transfer signal TR from the transfer signal generator 11, the latch controller 13 supplies a high-level data latch signal DL to the data latch circuit 14. The data latch circuit 14 latches the data D transferred from the data transfer circuit 12, in response to the rising of the data latch signal DL to the high level from the low level. The latched data is supplied to an output circuit (not shown) as output data Dout. When the external clock signal C is supplied, the system including this data transfer apparatus operates, whereas when the supply of the external clock signal C is stopped, this system enters the standby mode. When the system is in operation, the data latch circuit 14 supplies the output signal Dout every given period in response to the data latch signal DL originating from the clock signal CLK. This means that the data D produced by the data generator 10 is monitored every given period. Further, when the system is in the standby mode, the data latch circuit 14 supplies the output signal Dout for each period longer than the mentioned given period. This means that the data D produced by the data generator 10 is monitored every longer period.

Figure 13:
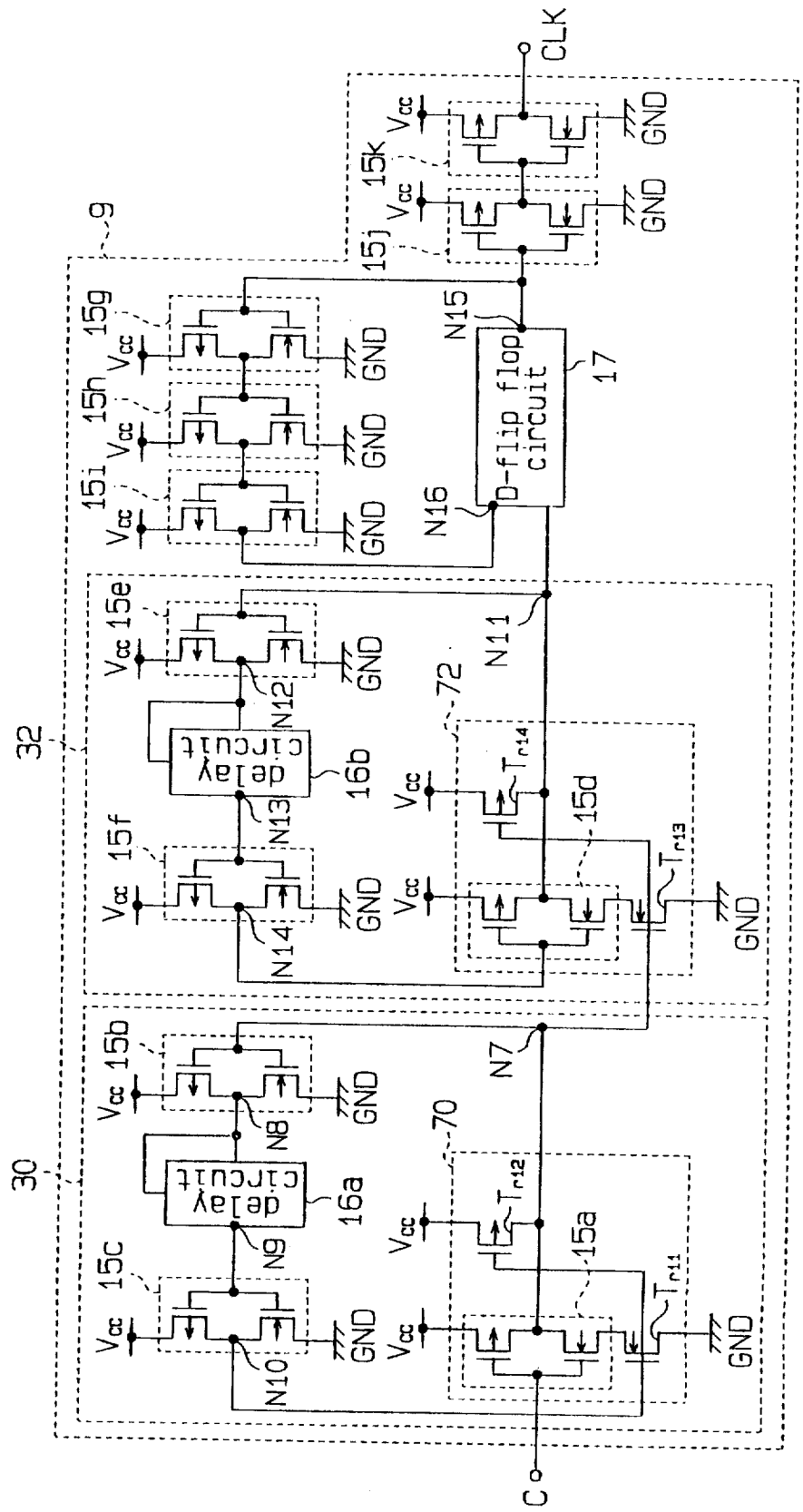
FIG. 13 is a circuit diagram illustrating a clock signal generator according to the third embodiment.

FIG. 13 presents a circuit diagram showing the clock signal generator 9. The generator 9 includes first and second oscillators 30 and 32, a D flip-flop circuit 17 and five CMOS inverter circuits 15g to 15k. The first oscillator 30 has two CMOS inverter circuits 15c and 15b, a delay circuit 16a and a NAND gate 70. The second oscillator 32 has two CMOS inverter circuits 15e and 15f, a delay circuit 16b and a NAND gate 72. The NAND gate 70 includes a CMOS inverter circuit 15a, an N channel MOS transistor Tr11 and a P channel MOS transistor Tr12. The NAND gate 72 likewise includes a CMOS inverter circuit 15d, an N channel MOS transistor Tr13 and a P channel MOS transistor Tr14.

In the first oscillator 30, the transistor Tr11 is connected between an N channel MOS transistor included in the inverter circuit 15a and the ground GND. The transistor Tr12 is connected between the output terminal (node N7) of the inverter circuit 15a and the power supply $V_{cc}$. The inverter circuit 15a has an input terminal connected to the external clock signal C. The inverter circuit 15b has an input terminal connected to the node N7 and an output terminal (node N8) connected to the input terminal of the delay circuit 16a. The inverter circuit 15c has an input terminal connected to the output terminal (node N9) of the delay circuit 16a and an output terminal (node N10) connected to the input gates of the transistors Tr11 and Tr12.

Figure 14:
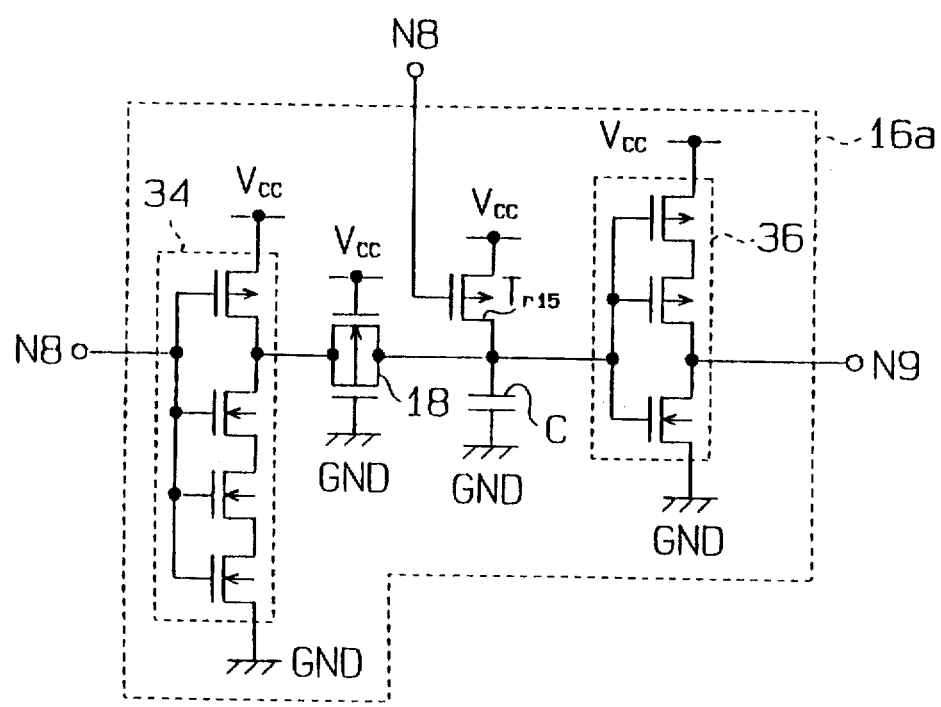
FIG. 14 is a circuit diagram showing a delay circuit.

FIG. 14 presents a circuit diagram showing the delay circuit 16a. The delay circuit 16a includes inverter circuits 34 and 36, a transfer gate 18, a P channel MOS transistor Tr15 and a capacitor C. The inverter circuit 34 includes one P channel MOS transistor and three N channel MOS transistors connected in series between the power supply $V_{cc}$ and the ground GND. The inverter circuit 34 further has an input terminal connected to the node N8 and an output terminal is connected to the transfer gate 18. This input terminal is connected commonly to the gates of the individual transistors, and the output terminal is connected between the PMOS transistor and the NMOS transistors. This inverter circuit 34 supplies an output signal which has a slow fall time from the high level to the low level for the following reason. The resistance when each NMOS transistor is turned on in response to the rising of the potential at the node N8 substantially increases the threshold value of the inverter circuit 34. The transfer gate 18 has an N channel gate terminal connected to the power supply VCC and a P channel gate terminal connected to the ground GND, and is normally set on. Thus, this transfer gate 18 serves as a resistor. The inverter circuit 36 has an input terminal connected to the transfer gate 18. The PMOS transistor Tr15 is connected between the input terminal of the inverter circuit 36 and the power supply $V_{cc}$. The capacitor C is connected between the input terminal of the inverter circuit 36 and the ground GND. The inverter circuit 36 includes two P channel MOS transistors and one N channel MOS transistor connected in series between the power supply $V_{cc}$ and the ground GND. The connection between the PMOS transistors and the NMOS transistor is connected to a node N9. This inverter circuit 36 supplies an output signal (node N9) which has a slow rise time from the low level to the high level for the following reason. The resistance when each PMOS transistor is turned on in response to the falling of the potential at the node N8 substantially decreases the threshold value of the inverter circuit 36.

This delay circuit 16a receives the external clock signal C from the input terminal (node N8) via NAND gate 70 and inverter 15b. At this time, the slow high-to-low falling of the output signal of the inverter circuit 34 and the intermittent ON/OFF actions of the transistor Tr15 charge the capacitor C, thereby holding the input signal to the inverter circuit 36 at the high level. As a result, the delay circuit 16a holds the node N9 low. When the supply of the external clock signal C is stopped and the node N8 is fixed to the low level, the delay circuit 16a likewise holds the node N9 at the low level. When the node N8 is fixed to the high level, the charges accumulated in the capacitor C are discharged via the transfer gate 18 by the inverter circuit 34, so that the potential at the input terminal of the inverter circuit 36 gradually decreases. As a result, the delay circuit 16a sets the potential at the node N9 high when a predetermined delay time passes after the rising of the potential at the node N8.

In the second oscillator 32, as shown in FIG. 13, the transistor Tr13 is connected between an N channel MOS transistor included in the inverter circuit 15d and the ground GND. The transistor Tr14 is connected between the output terminal (node N11) of the inverter circuit 15d and the power supply $V_{cc}$. Both transistors Tr13 and Tr14 have gates connected to the node N7. The inverter circuit 15e has an input terminal connected to the node N11 and an output terminal (node N12) connected to the input terminal of the delay circuit 16b. This delay circuit 16b has the same structure as the delay circuit 16a. The inverter circuit 15f has an input terminal connected to the output terminal (node N13) of the delay circuit 16b and an output terminal (node N14) connected to the input terminal of the inverter circuit 15d.

The D flip-flop circuit 17 has a clock input terminal connected to the node N11. The D flip-flop circuit 17 further has an output terminal (node N15) connected to the input terminal of the first-stage inverter circuit 15g among the three stages of series-connected inverter circuits 15g, 15h and 15i, and an input terminal connected to the output terminal of the last-stage inverter circuit 15i. The individual N channel MOS transistors included in the first-stage and last-stage inverter circuits 15g and 15i have greater gate widths than the P channel MOS transistors included in those inverter circuits. Further, the P channel MOS transistor included in the middle inverter circuit 15h has a greater gate width than the N channel MOS transistor included in this inverter circuit. Therefore, the delay time for the inverter circuits 15g, 15h and 15i to supply signals in response to the rising of the potential at the node N15 becomes longer than the delay time for the inverter circuits to supply signals in response to the falling of that potential. Of the series-connected two inverter circuits 15j and 15k, the first inverter circuit 15j has an input terminal connected to the output terminal (node N15) of the D flip-flop circuit 17. The second inverter circuit 15k has an output terminal from which the clock signal CLK from the clock signal generator 9 is output.

Figure 15:
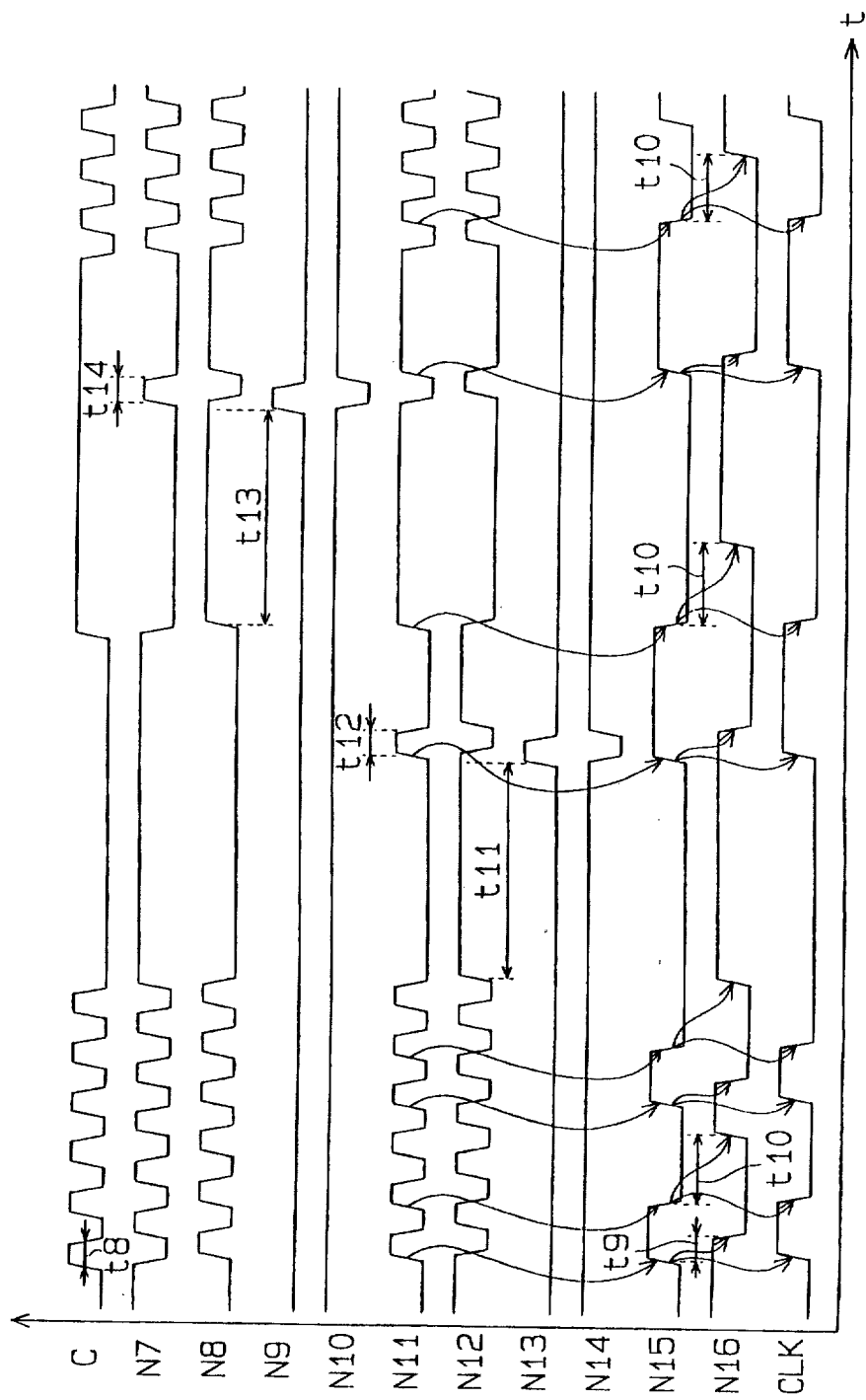
FIG. 15 is a waveform chart illustrating the operation of the clock signal generator in FIG. 13.

The operation of this clock signal generator 9 will be described with reference to FIG. 15. In response to the external clock signal C having the pulse width t8, the NAND gate 70 outputs a pulse signal of the opposite phase to the phase of the external clock C from the node N7. The inverter circuit 15b outputs a pulse signal from the node N8, which has the opposite phase to the phase of the pulse signal from the node N7. The delay circuit 16a charges its own capacitor C to fix the node N9 to the low level in response to the pulse signal from the node N8. The inverter circuit 15c fixes the node N10 to the high level. In this manner, the individual nodes N7 to N10 reliably hold the potentials of the aforementioned levels.

The NAND gate 72 outputs a pulse signal from the node N11, which is the opposite phase to the phase of the pulse signal from the node N7. The inverter circuit 15e outputs a pulse signal from the node N12, which has the opposite phase to the phase of the pulse signal from the node N1. In response to the pulse signal from the node N12, the delay circuit 16b fixes the node N13 to the low level and the inverter circuit 15f fixes the node N14 to the high level. In this manner, the individual nodes N11 to N14 reliably hold the potentials of the aforementioned levels.

In response to the pulse signal from the node N11, the D flip-flop circuit 17 supplies the potential at the node N16 from the node N15 every time that signal rises. When the potential at the node N11 rises and the potential at the node N16 is high, for example, the potential at the node N15 rises to the high level. The potential at the node N16 falls when a delay time t9 provided by the inverter circuits 15g, 15h and 15i passes after the rising of the potential at the node N15. After the falling of the potential at the node N16, the potential at the node N15 falls in response to the rising of the potential at the node N11. Subsequently, the potential at the node N16 rises when a delay time t10 created by the inverter circuits 15g, 15h and 15i passes after the falling of the potential at the node N15. During this delay time t10 which is sufficiently longer than the delay time t9, the node N16 holds the low level. This permits the node N15 to keep holding the low level when the potential at the node N11 rises during that delay time t10.

After the passage of the time t10, the D flip-flop circuit 17 rises the potential at the node N15 in response to the rising of the potential at the node N16 and the rising of the potential at the node N1. The D flip-flop circuit 17 supplies a pulse signal from the node N15 in this manner. The clock signal generator 9 outputs that pulse signal as the clock signal CLK via the inverter circuits 15j and 15k. When the external clock signal C is supplied, therefore the generator 9 outputs the clock signal CLK having the pulse width equal to one period of the external clock signal C. Further, the low-pulse width and frequency of this clock signal CLK are determined by the delay time t10 made by the inverter circuits 15g, 15h and 15i. The clock signal CLK has the adequate frequency for the operation of the data generator 10 and the transfer signal generator 11. Therefore, the D flip-flop circuit 17 and the inverter circuits 15g, 15h and 15i serve as a frequency stabilizer for stabilizing the frequency of the clock signal CLK. When the external clock signal C is supplied, as mentioned above, the clock signal generator 9 can output the clock signal of a predetermined frequency which is synchronous with the external clock signal C, due to the function of the frequency stabilizer.

When the supply of the external clock signal C is stopped and its potential is fixed to the low level, the node N7 holds the high potential, the nodes N8 and N9 hold the low potential, and the node N10 holds the high potential in the first oscillator 30. In the second oscillator 32, the node N11 holds the low potential, and the node N12 holds the high potential. The delay circuit 16b sets the node N13 high with the delay time t11 after the rising of the potential at the node N12. The potential at the node N14 falls in response to the rising of the potential at the node N13. In response to the falling of the potential at the node N14 and the rising of the potential at the node N7, the NAND gate 72 sets the node N11 high. In response to this potential rising, the node N12 falls, the node N13 falls and the node N14 rises. In response to the rising of the potential at the node N14 and the potential at the node N7 high, the NAND gate 72 sets the node N11 low. In this manner, the second oscillator 32 oscillates a pulse signal having a pulse width t12, which is in turn supplied to the D flip-flop circuit 17. This signal pulse periodically appears every time the delay time t11 of the delay circuit 16b passes after the rising of the potential at the node N12 while the external clock signal C is fixed to the low level. Further, the pulse width t12 is determined by the delay time of the inverter circuits 15d, 15e and 15f.

When the NAND gate 72 sets the node N11 high after the delay time t11, the node N16 has already been set back to the high level. This permits the rising of the potential at the node N15 and the subsequent rising of the clock signal CLK. When the next pulse rises at the node N11 after the rising of the potential at the node N15, the node N15 is set low followed by the falling of the clock signal CLK. While the supply of the external clock signal C is stopped and this clock signal is fixed to the low level, the clock signal generator 9 outputs the clock signal CLK which repeats the rising and falling every time the delay time t11 of the delay circuit 16b passes. The frequency of this clock signal CLK is determined by the delay time t11 of the delay circuit 16b and is set lower than the frequency of the external clock signal C.

When the supply of the external clock signal C is stopped and the potential level of this clock signal is fixed to the high level, the potential at the node N7 falls to the low level and the potential at the node N8 rises to the high level in the first oscillator 30. The delay circuit 16a sets the node N9 high with the delay time t13 from the rising of the potential at the node N8. The rising of the potential at the node N9 permits the potential at the node N7 to rise via the inverter circuit 15c, NAND gate 70, inverter circuit 15b and delay circuit 16a, and also permits the potential at the node N7 to fall after the passage of the delay time t14. In this manner, the first oscillator 30 oscillates a pulse signal having the pulse width t14, which is in turn supplied to the NAND gate 72 from the node N7. This signal pulse periodically appears every time the delay time t13 of the delay circuit 16a passes after the rising of the potential at the node N8. Further, the pulse width t14 is determined by the delay time of the inverter circuits 15a, 15b and 15c.

When the pulse signal is supplied to the second oscillator 32 from the node N7, a signal of the opposite phase to the phase of that pulse signal is output from the node N11 and a signal of the opposite phase to the phase of that signal from the node N11 is output from the node N12. The high-level pulse width of the opposite phase output from the node N12 is sufficiently smaller than the delay time t11 of the delay circuit 16b. This allows the delay circuit 16b to keep supplying the low-potential signal from the node N13, causing the node N14 to hold the high potential.

When the signal of the opposite phase from the node N11 rises, the node N16 has already been set back to the high level. This permits the rising of the potential at the node N15 and the subsequent rising of the clock signal CLK. When the next pulse rises at the node N11 after the rising of the potential at the node N15, the node N15 is set low followed by the falling of the clock signal CLK. While the supply of the external clock signal C is stopped and this clock signal is fixed to the high level, the clock signal generator 9 outputs the clock signal CLK which repeats the rising and falling every time the delay time t13 of the delay circuit 16a passes. The frequency of this clock signal CLK is determined by the delay time t13 of the delay circuit 16a and is set lower than the frequency of the external clock signal C. As described above, when the supply of the external clock signal C is stopped and this clock signal C is fixed to the low or high level, the clock signal CLK rises to the high level with a predetermined delay time from the rising or falling of the clock signal C. This permits the clock signal generator 9 to reliably output the clock signal CLK having a predetermined pulse width and prevents the occurrence of glitch.

Fourth Embodiment

Figure 16:
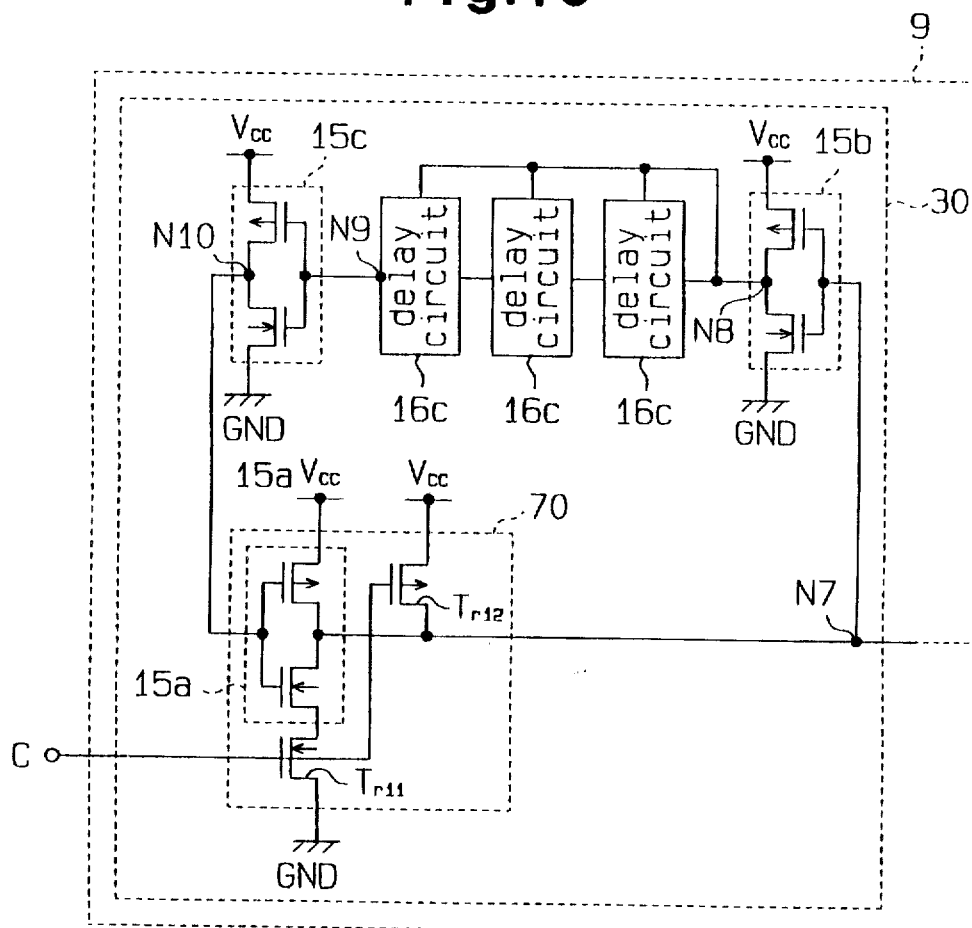
FIG. 16 is a circuit diagram illustrating a clock signal generator according to the fourth embodiment.

FIG. 16 shows another example of the first oscillator 30 in the clock signal generator 9. The first oscillator 30 has multiple stages (three stages in this case) of delay circuits 16c connected in series between the inverter circuits 15b and 15c. Each delay circuit 16c has an input terminal for receiving the output signal from the inverter circuit 15b as a reset signal. Those delay circuits 16c prolong the transmission delay time for the signal from the inverter circuit 15b to the inverter circuit 15c. This permits the frequency of the clock signal CLK to be adjusted when the supply of the external clock signal C is stopped. The second oscillator 32 likewise has multiple stages of delay circuits 16c.

Figure 17:
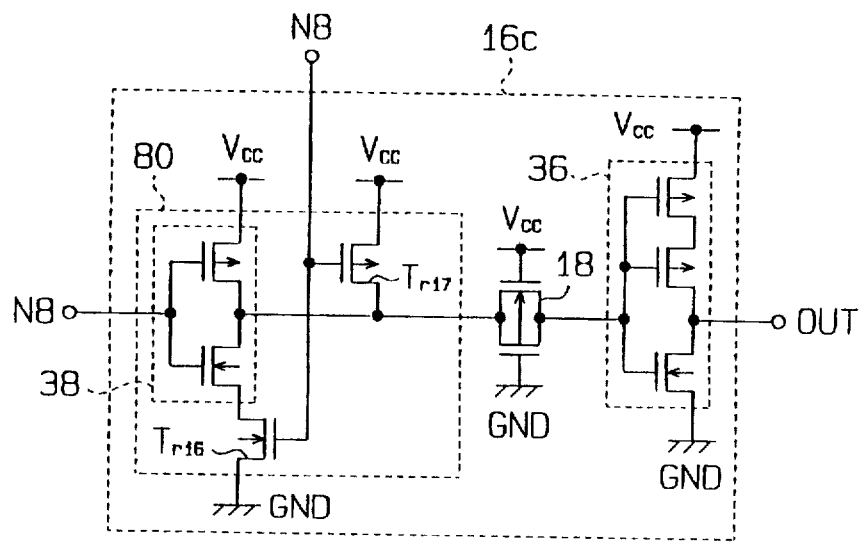
FIG. 17 is a circuit diagram showing another delay circuit.

FIG. 17 is a circuit diagram showing the delay circuit 16c. This delay circuit 16c includes a NAND gate 80, the transfer gate 18 and the inverter circuit 36. The NAND gate 80 includes an inverter circuit 38, an N channel MOS transistor Tr16 and a P channel MOS transistor Tr17. The transistor Tr16 is connected between an N channel MOS transistor included in the inverter circuit 38 and the ground GND. The transistor Tr17 is connected between the output terminal of the inverter circuit 38 and the power supply $V_{cc}$. The transistors Tr16 and Tr17 have gates responsive to the reset signal from the node N8. The output terminal of the inverter circuit 38 is connected to the input terminal of the inverter circuit 36 via the transfer gate 18. This transfer gate 18 has the same structure as the transfer gate of the third embodiment.

When the potential at the node N8 rises to the high level, the potential at the node N9 rises with some delay caused by those delay circuits 16c. When the potential at the node N8 falls to the low level, the transistor Tr17 is turned on, immediately setting the node N9 low. This permits the delay circuits 16c to operate in the same manner as the delay circuit 16a in the third embodiment.

Fifth Embodiment

Figure 18:
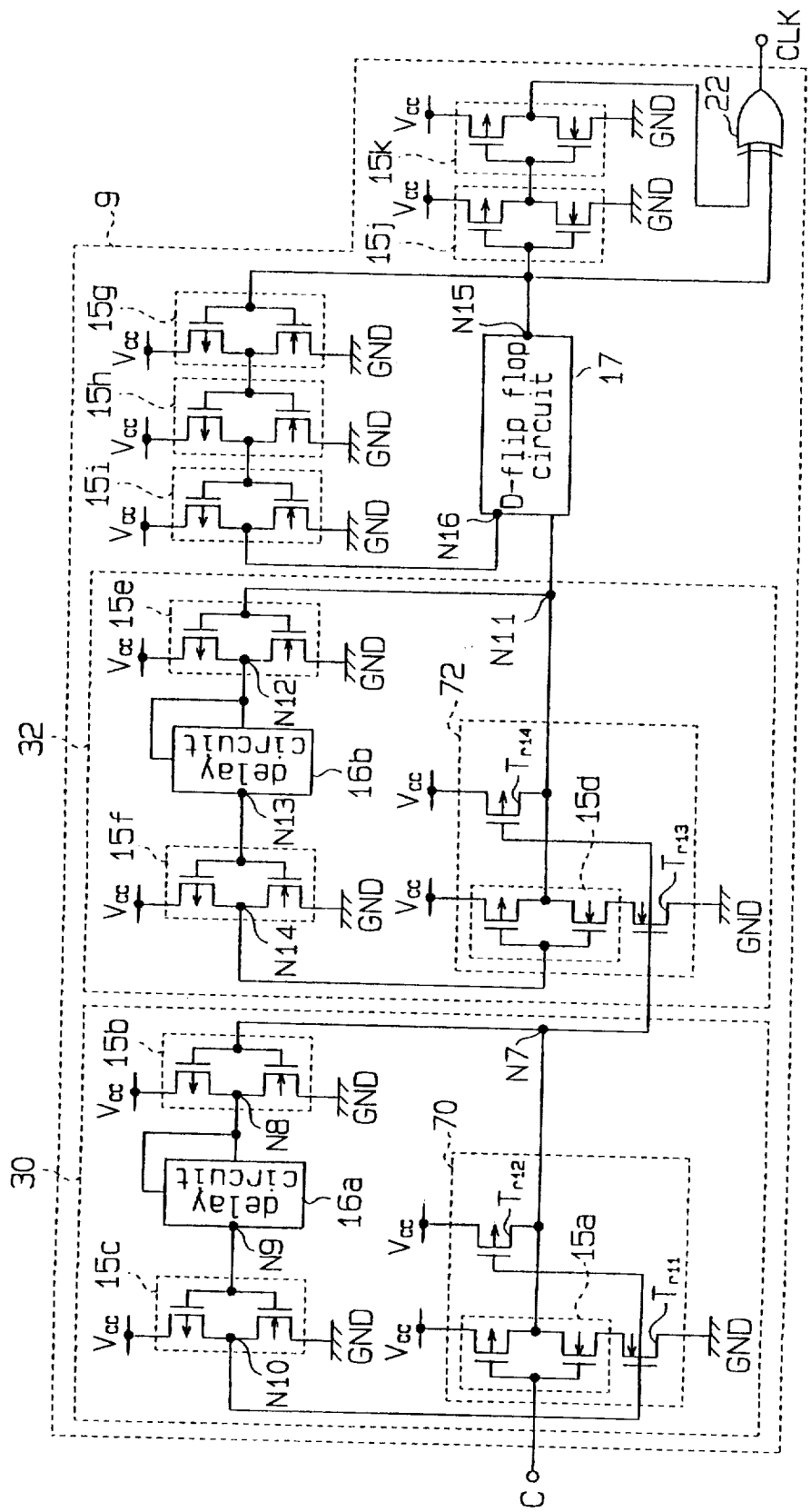
FIG. 18 is a circuit diagram illustrating a clock signal generator according to the fifth embodiment.

FIG. 18 presents a circuit diagram showing a clock signal generator 9 according to the fifth embodiment. This generator has an EOR gate 22 in addition to the circuits 30, 32, 17 and 15g–15k of the clock signal generator 9 of the third embodiment. The EOR gate 22 has a first input terminal connected to the output terminal (node N15) of the D flip-flop, a second input terminal connected to the output terminal of the inverter circuit 15k, and an output terminal from which the clock signal CLK is output. In response to the first pulse signal output from the node N15 and the second pulse signal from the inverter circuit 15k, the EOR gate 22 outputs the clock signal CLK having twice the frequency of the second pulse signal. In other words, the EOR gate 22 outputs the clock signal CLK having the same frequency as the external clock signal C.

Sixth Embodiment

Figure 19:
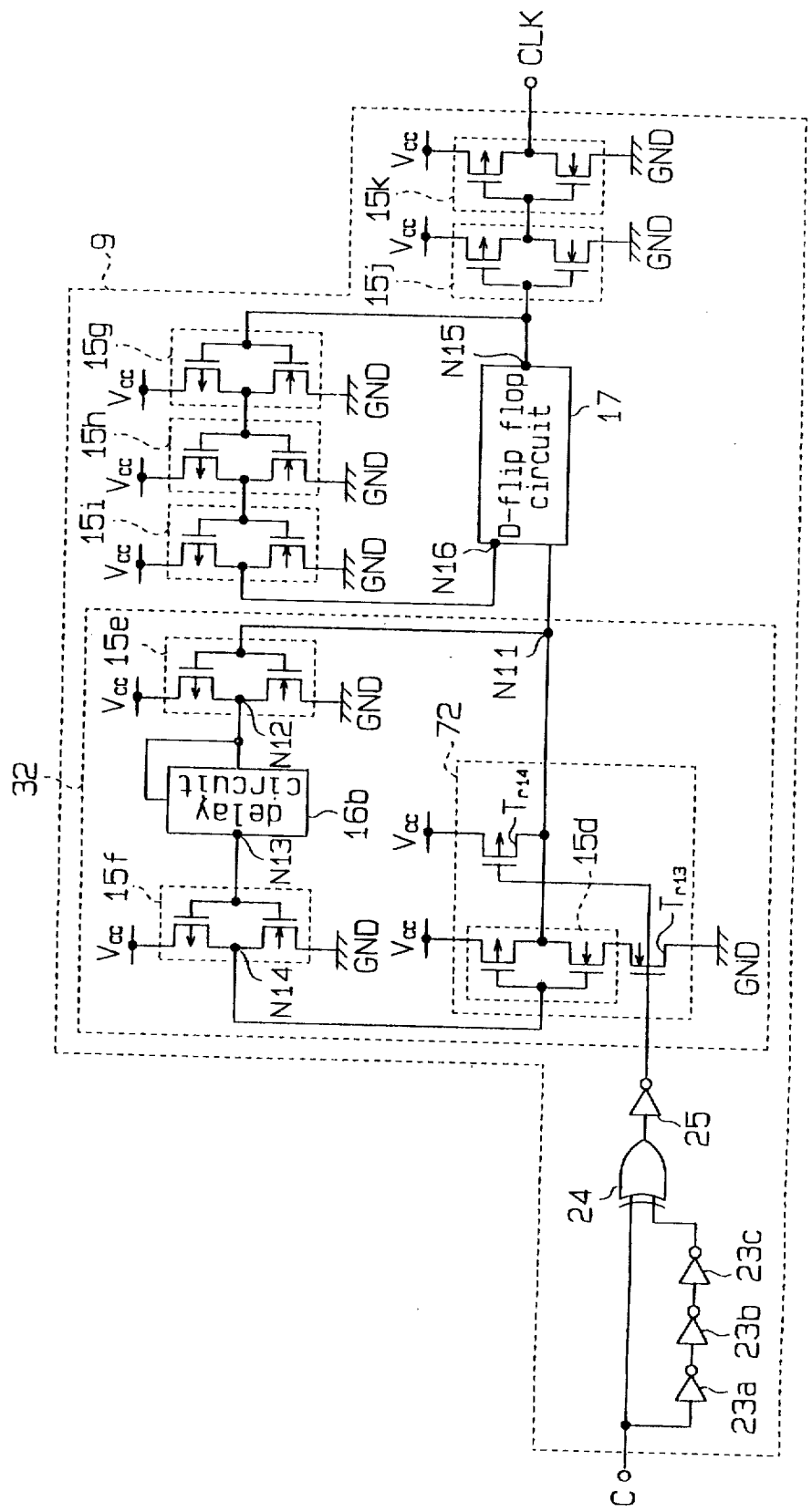
FIG. 19 is a circuit diagram illustrating a clock signal generator according to the sixth embodiment.

FIG. 19 presents a circuit diagram showing a clock signal generator 9 according to the sixth embodiment. This generator has an EOR gate 24 and inverter circuits 23a, 23b, 23c and 25 in addition to the second oscillator 32, D flip-flop circuit 17 and inverter circuits 15g–15k. The EOR gate 24 has a first input terminal responsive to the external clock signal C, a second input terminal connected to the first input terminal via the three stages of inverter circuits 23a–23c, and an output terminal connected to the gates of the transistors Tr13 and Tr14 via the inverter circuit 25. In response to the rising and falling of the external clock signal C, the EOR gate 24 supplies a pulse signal having the high-level and low-level pulse widths to the transistors Tr13 and Tr14 of the NAND gate 72 via the inverter circuit 25. The high-level and low-level pulse widths of this pulse signal are determined by the delay time determined by the inverter circuits 23a–23c, and this signal has twice the frequency of the external clock signal C. Therefore, the NAND gate 72 supplies the double-frequency pulse signal to the D flip-flop circuit 17 from the node N11. In response to this pulse signal, the frequency stabilizer consisting of the D flip-flop circuit 17 and inverter circuits 15g, 15h and 15i supplies the clock signal CLK having the same frequency as the external clock signal C. Therefore, the sixth embodiment becomes advantageous for the data generator 10 and the transfer signal generator 11, which are responsive to the clock signal CLK having the same frequency as the external clock signal C.

When the supply of the external clock signal C is stopped and the potential of this clock signal is fixed high or low, the inverter circuit 25 supplies the high-level output signal. When the high-level output signal is kept supplied for a period longer than the delay time t11 of the delay circuit 16b, the oscillator 32 supplies the pulse signal from the node N11 every time the time t11 passes from the point of the rising of the output signal. Based on the pulse signal from the node N11, the clock signal generator 9 supplies the clock signal CLK. Since the generator 9 of the sixth embodiment, unlike in the third embodiment, does not require the first oscillator 30, it is possible to reduce the self-occupying circuit area.

Although six embodiments of the present invention have been described herein, it should be apparent to those skilled in the art that the present invention may be embodied in many other specific forms without departing from the spirit or scope of the invention. Particularly, it should be understood that this invention may be embodied in the following forms.

Instead of the transfer gate 18 which is included in the delay circuits 16a and 16b and serves as a resistor, an N channel MOS transistor and a P channel MOS transistor which are normally set on may be used.

Therefore, the present examples and six embodiments are to be considered as illustrative and not restrictive and the invention is not to be limited to the details given herein, but may be modified within the scope of the appended claims.

What is claimed is:

1. A pulse signal shaper for shaping an input signal, comprising:

an input circuit including a first NAND gate for receiving a plurality of input signals and outputting a first pulse signal in response to the input signals, said first pulse signal including a pulse having a non-uniform pulse width;

a delay circuit including a plurality of inverter circuits connected in series, said delay circuit receiving a second pulse signal and outputting a delayed pulse signal obtained by delaying said second pulse signal by a predetermined time; and a signal mixing circuit connected to said input circuit and said delay circuit, said signal mixing circuit receiving said first pulse signal and said delayed pulse signal as inputs and forming said second pulse signal, said second pulse signal having a substantially constant pulse width, wherein said signal mixing circuit includes a second NAND gate, connected to said first NAND gate for producing said second pulse signal, wherein said signal mixing circuit produces an intermediate pulse signal having a predetermined pulse width in response to said delayed pulse signal from said delay circuit and said second pulse signal from said second NAND gate, and wherein said second NAND gate produces said second pulse signal in response to said intermediate pulse signal.

2. A pulse signal shaper for shaping an input signal, comprising:

an input circuit including a first NAND gate responsive to a first input signal and a second input signal and outputting a first pulse signal in response to the first and second input signals, said first pulse signal including a pulse having a non-uniform pulse width;

a delay circuit including a plurality of inverter circuits connected in series, said delay circuit receiving a second pulse signal and outputting a delayed pulse signal obtained by delaying said second pulse signal by a predetermined time; and a signal mixing circuit connected to said input circuit and said delay circuit, said signal mixing circuit receiving said first pulse signal and said delayed pulse signal as inputs and forming said second pulse signal, said second pulse signal having a substantially constant pulse width, wherein said signal mixing circuit includes a second NAND gate, connected to said first NAND gate for producing said second pulse signal, and a third NAND gate, connected to said delay circuit and said second NAND gate, for producing an intermediate pulse signal having a predetermined pulse width in response to said delayed pulse signal and said second pulse signal, and wherein said second NAND gate produces said second pulse signal in response to said intermediate pulse signal and said first pulse signal.

3. A pulse signal shaper for shaping an input signal, comprising:

an input circuit including an inverter circuit for receiving an input signal as an input of said pulse signal shaper and outputting a first pulse signal to response thereto, said first pulse signal including a pulse signal that has a non-uniform pulse width;

a delay circuit including a plurality of inverter circuits connected in series, said delay circuit receiving a second pulse signal and outputting a delayed pulse signal obtained by delaying said second pulse signal by a predetermined time; and a signal mixing circuit connected to said input circuit and said delay circuit, said signal mixing circuit receiving said first pulse signal and said delayed pulse signals as inputs and forming said second pulse signal said, second signal having a substantially constant pulse width, said signal mixing circuit including a first NAND gate, connected to said input circuit, for producing said second pulse signal, and a second NAND gate, connected to said delay circuit and said first NAND gate, for producing an intermediate pulse signal having a predetermined pulse width in response to said delayed pulse signal and said second pulse signal, wherein said first NAND gate produces said second pulse signal in response to said intermediate pulse signal and said first pulse signal.

4. A pulse signal shaper for shaping an input signal, comprising:

an input circuit including a first inverter circuit for receiving a first input signal and outputting a first pulse signal in response thereto, said first pulse signal including a pulse having a non-uniform pulse width;

a delay circuit including a plurality of inverter circuits connected to series, said delay circuit receiving a second pulse signal and outputting a delayed pulse signal obtained by delaying said second pulse signal by a predetermined time; and a signal mixing circuit connected to said input circuit and said delay circuit, said signal mixing circuit receiving said first pulse signal and said delayed pulse signal as inputs and forming said second pulse signal, said second pulse signal having a substantially constant pulse width, said signal mixing circuit including a first NAND gate, connected to said input circuit for producing said second pulse signal, and a second NAND gate, connected to said delay circuit and said first NAND gate, for producing an intermediate pulse signal having a predetermined pulse width in response to said delayed pulse signal and said second pulse signal, wherein said first NAND gates produces said second pulse signal in response to said intermediate pulse signal and said first pulse signal.

5. A pulse signal shaper for shaping an input signal, comprising:

an input circuit including an oscillator device for receiving the input signal and outputting a first pulse signal in response thereto, said first pulse signal including a pulse having a non-uniform pulse width;

a delay circuit including a plurality of first inverter circuits connected in series, said delay circuit receiving a second pulse signal and outputting a delayed pulse signal obtained by delaying said second pulse signal by a predetermined time;

a signal mixing circuit connected to said input circuit and said delay circuit, said signal mixing circuit receiving said first pulse signal and said delayed pulse signal as inputs and forming said second pulse signal, said second pulse signal having a substantially constant pulse width, wherein when the input signal has a frequency higher than a predetermined frequency, the input signal is passed through the oscillator device and outputted as the first pulse signal, and when the input signal has a frequency lower than the predetermined frequency, the first pulse signal is supplied at a designated frequency; and said signal mixing circuit includes a D flip-flop circuit having a clock terminal for receiving said first pulse signal as a clock signal, a data terminal, and an output terminal connected to the data terminal via said plurality of first inverter circuits, wherein said D flip-flop circuit is responsive to said first pulse signal from said oscillator device and said delayed pulse signal from said delay circuit and supplies to said output terminal said second pulse signal.

6. The pulse signal shaper according to claim 5, wherein said oscillator device includes a plurality of second inverter circuits, an internal delay circuit provided between a first stage of the second inverter circuits and a final stage of the second inverter circuits, and a first NAND gate responsive to said input signal and the final stage of the plurality of second inverter circuits, the plurality of second inverter circuits, the internal delay circuit and the first NAND gate being connected in a ring, wherein the internal delay circuit is responsive to an inverted signal supplied from the first stage of the second inverter circuits, and when the inverted signal rises from a low level to a high level, the internal delay circuit supplies a delay signal having a delay of at least a pulse width of said input signal to each second inverter circuit which is located downstream thereof.

7. The pulse signal shaper according to claim 6, wherein said oscillator device comprises a first oscillator and a second oscillator, wherein said first oscillator includes a second NAND gate responsive to said input signal, and said second oscillator includes a third NAND gate connected to said second NAND gate and responsive to an output signal from said second NAND gate.

8. The pulse signal shaper according to claim 6, wherein the internal delay circuit includes an even number of third inverter circuits connected in series and a reset circuit responsive to a first inverted signal supplied from one of said second inverter circuits, wherein said third inverter circuits have a relatively long delay time from receiving a rise in said first inverted signal to outputting a corresponding rise in said delay signal, and a relatively short delay time from receiving a fall in said first inverted signal to outputting a corresponding fall in said delay signal due to an operation of said reset circuit.

9. The pulse signal shaper according to claim 8, wherein each of said third inverter circuit includes a first stage inverter circuit for supplying a second inverted signal for a longer time when said second delay signal falls to a low level than when said second delay signal rises to a high level and a second stage inverter circuit for supplying a third inverted signal for a longer time when said third inverted signal rises to a high level than when said third inverted signal falls to a low level; and said reset circuit is connected between said first and second stage inverter circuits and includes a P channel MOS transistor and a capacitor connected in series between a high-potential power supply and a low-potential power supply, wherein said transistor has a gate terminal responsive to said first inverted signal supplied from one of said second inverter circuits connected to the first stage inverter thereof.

10. The pulse signal shaper according to claim 8, wherein said internal delay circuit includes a NAND gate, said NAND gate comprising a first stage of inverter circuit among said third inverter circuits, a P channel transistor and an N channel transistor responsive to said first inverted signal, said P channel and N channel transistors serving as said reset circuit.

11. The pulse signal shaper according to claim 5, wherein said oscillator device comprises a first oscillator and a second oscillator, said first oscillator is responsive to said input signal, wherein when the input signal is held at a high-level potential for at least a first preset period, the first oscillator outputs said first pulse signal with a period equal to said first preset period to said D flip-flop, and when the input is held at the high-level potential for a period shorter than said first preset period, the first oscillator outputs said first pulse signal with the same period as said input signal to said D flip-flop, and said second oscillator is responsive to said input signal, wherein when the input signal is held at a low-level potential for at least a second preset period, the second oscillator outputs said first pulse signal with a period equal to said second preset period to said D flip-flop, and when the input signal is held at a low-level potential for a period shorter than said second preset period, the second oscillator outputs said first pulse signal with the same period as said input signal to said D flip-flop.

12. The pulse signal shaper according to claim 5, further comprising an XOR gate and an even number of second inverter circuits connected in series, said XOR gate having a first input terminal connected to an output terminal of said D flip-flop circuit, a second input terminal connected to said output terminal of said D flip-flop circuit via said second inverter circuits, and an output terminal from which said second pulse signal having a same period as said input signal is supplied.

13. The pulse signal shaper according to claim 5, wherein said input circuit further includes an XOR gate and an odd number of second inverter circuits connected in series, said XOR gate having a first input terminal responsive to said input signal, a second input terminal connected to said first input terminal via said second inverter circuits, and an output terminal which provides a secondary input signal having twice a frequency of said input signal to said oscillator device, said oscillator is responsive to said secondary input signal, wherein when the input signal is held at a low-level potential or a high-level potential for at least a preset period, the oscillator outputs said first pulse signal with a period equal to said preset period to said D flip-flop, and when the input signal is held at a low-level or high-level potential for a period shorter than said preset period, the oscillator outputs said first pulse signal with the same period as said secondary input signal to said D flip-flop.

* * * * *